(12) United States Patent
Narayanan

(10) Patent No.: US 11,538,819 B2
(45) Date of Patent: Dec. 27, 2022

(54) INTEGRATED CIRCUITRY, A METHOD USED IN FORMING INTEGRATED CIRCUITRY, AND A METHOD USED IN FORMING A MEMORY ARRAY COMPRISING STRINGS OF MEMORY CELLS

(71) Applicant: Micron Technology, inc., Boise, ID (US)

(72) Inventor: Purnima Narayanan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 180 days.

(21) Appl. No.: 16/930,843

(22) Filed: Jul. 16, 2020

(65) Prior Publication Data

US 2022/0020759 A1  Jan. 20, 2022

(51) Int. Cl.
*H01L 21/00* (2006.01)
*H01L 27/11556* (2017.01)
*H01L 25/065* (2006.01)
*H01L 21/50* (2006.01)
*G11C 5/02* (2006.01)
*G11C 5/06* (2006.01)
*H01L 27/11582* (2017.01)

(52) U.S. Cl.
CPC ........ *H01L 27/11556* (2013.01); *G11C 5/025* (2013.01); *G11C 5/06* (2013.01); *H01L 21/50* (2013.01); *H01L 25/0657* (2013.01); *H01L 27/11582* (2013.01)

(58) Field of Classification Search
CPC ...................................................... H01L 21/50
See application file for complete search history.

(56) References Cited

U.S. PATENT DOCUMENTS

| | | | |
|---|---|---|---|
| 5,656,536 A * | 8/1997 | Wu ................... | H01L 27/10852 257/E21.648 |
| 6,114,201 A * | 9/2000 | Wu ....................... | H01L 28/87 438/254 |
| 9,875,929 B1 * | 1/2018 | Shukla .............. | H01L 29/40117 |
| 9,985,049 B1 * | 5/2018 | Sandhu ............. | H01L 29/40117 |
| 11,205,654 B2 * | 12/2021 | Hu .................... | H01L 27/11582 |
| 2015/0380423 A1 * | 12/2015 | Kanakamedala .......................... | H01L 27/11556 438/264 |
| 2016/0172366 A1 * | 6/2016 | Koka ................ | H01L 27/11582 257/314 |
| 2020/0295040 A1 * | 9/2020 | Tobioka ........... | H01L 27/11575 |
| 2022/0005819 A1 * | 1/2022 | Howder ............. | H01L 27/1157 |
| 2022/0077169 A1 * | 3/2022 | Hu .................... | H01L 27/11565 |

OTHER PUBLICATIONS

U.S. Appl. No. 16/921,641, filed Jul. 6, 2020, by Howder et al.

* cited by examiner

*Primary Examiner* — Nicholas J Tobergte
(74) *Attorney, Agent, or Firm* — Wells St. John P.S.

(57) ABSTRACT

A method used in forming integrated circuitry comprises forming a stack comprising vertically-alternating first tiers and second tiers. The first tiers comprise doped silicon dioxide and the second tiers comprise undoped silicon dioxide. Horizontally-elongated trenches are formed into the stack. Through the trenches, the doped silicon dioxide that is in the first tiers is etched selectively relative to the undoped silicon dioxide that is in the second tiers. Conducting material is formed in the void space in the first tiers that is left by the etching. Structure independent of method is disclosed.

14 Claims, 6 Drawing Sheets

INTEGRATED CIRCUITRY, A METHOD USED IN FORMING INTEGRATED CIRCUITRY, AND A METHOD USED IN FORMING A MEMORY ARRAY COMPRISING STRINGS OF MEMORY CELLS

TECHNICAL FIELD

Embodiments disclosed herein pertain to integrated circuitry, to methods used in forming integrated circuitry, and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

DETAILED DESCRIPTION OF EXAMPLE EMBODIMENTS

Embodiments of the invention encompass methods used in forming integrated circuitry, for example memory circuitry, logic circuitry, or other existing or future-developed integrated circuitry. In one example, such integrated circuitry comprises a memory array, for example an array of NAND or other memory cells that may have at least some peripheral control circuitry under the array (e.g., CMOS-under-array). Embodiments of the invention also encompass existing or future-developed integrated circuitry independent of method of manufacture, for example memory circuitry comprising a memory array (e.g., NAND architecture). First example method embodiments are described with reference to FIGS. 1-15 which may be considered as a "gate-last" or "replacement-gate" process in the forming of memory circuitry, and starting with FIGS. 1-5.

Figure 1:
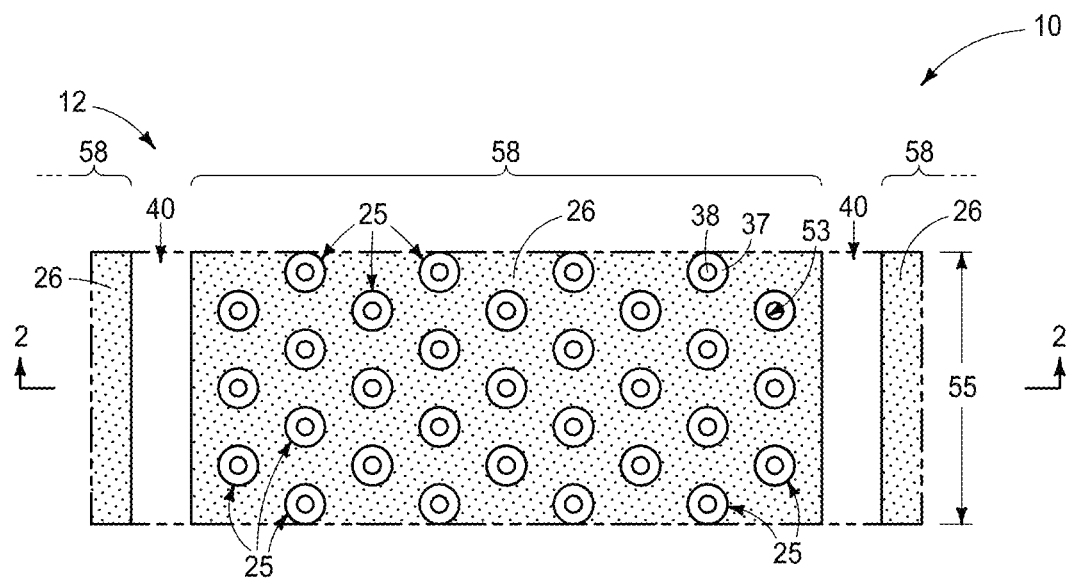
FIG. 1 is a diagrammatic cross-sectional view of a portion of a substrate in process in accordance with an embodiment of the invention and is taken through line 1-1 in FIG. 2.
Figure 2:
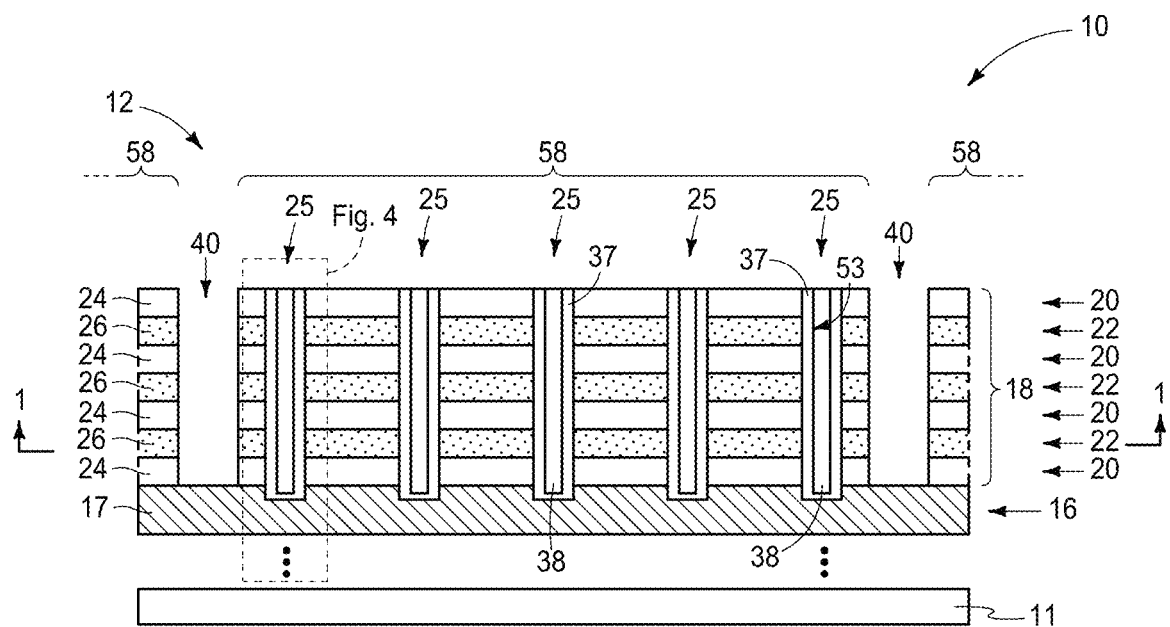
FIG. 2 is a diagrammatic cross-sectional view taken through line 2-2 in FIG. 1.
Figure 3:
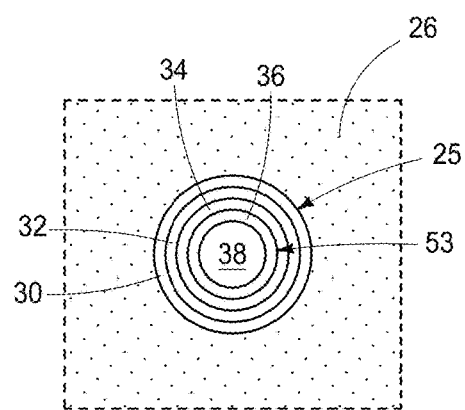
FIGS. 3 and 4 are enlarged views of portions of FIGS. 1 and 2.
Figure 4:
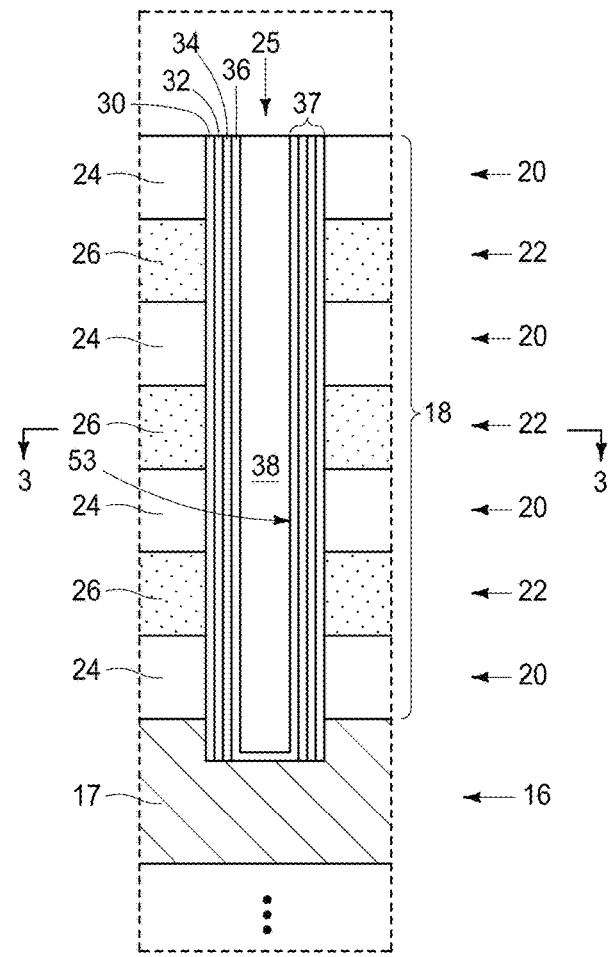

FIGS. 1 and 2 show a construction 10 having an array or array area 12 in which elevationally-extending strings of transistors and/or memory cells will be formed. Construction 10 comprises a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1-5-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductor material 17 has been formed above substrate 11. Conductor tier 16 may comprise part of control circuitry (e.g., peripheral-under-array circuitry and/or a common source line or plate) used to control read and write access to the transistors and/or memory cells that will be formed within array 12. A stack 18 comprising vertically-alternating insulative tiers 20 and conductive tiers 22 has been formed above conductor tier 16. Example thickness for each of tiers 20 and 22 is 22 to 60 nanometers. Only a small number of tiers 20 and 22 is shown, with more likely stack 18 comprising dozens, a hundred or more, etc. of tiers 20 and 22. Other circuitry that may or may not be part of peripheral and/or control circuitry may be between conductor tier 16 and stack 18. For example, multiple vertically-alternating tiers of conductive material and insulative material of such circuitry may be below a lowest of the conductive tiers 22 and/or above an uppermost of the conductive tiers 22. For example, one or more select gate tiers (not shown) may be between conductor tier 16 and the lowest conductive tier 22 and one or more select gate tiers may be above an uppermost of conductive tiers 22. Alternately or additionally, at least one of the depicted uppermost and lowest conductive tiers 22 may be a select gate tier. Regardless, conductive tiers 22 (alternately referred to as first tiers) may not comprise conducting material and insulative tiers 20 (alternately referred to as second tiers) may not comprise insulative material or be insulative at this point in processing in conjunction with the hereby initially-described example method embodiment which is "gate-last" or "replacement-gate". Example conductive tiers 22 comprise first material 26 (e.g., doped silicon dioxide) which may be wholly or partially sacrificial. Example insulative tiers 20 comprise second material 24 (e.g., undoped silicon dioxide) that is of different composition from that of first material 26 and which may be wholly or partially sacrificial.

In this document, a "doped silicon dioxide" has at least $1\times10^{12}$ atoms/cm$^3$ of total dopant atoms (whether in elemental-form, compound-form, and/or other form[s]) other than silicon and oxygen. In this document, an "undoped silicon dioxide" has less than $1\times10^{12}$ atoms/cm$^3$ of total dopant atoms (whether in elemental-form, compound-form, and/or other form[s]) other than silicon and oxygen.

In one embodiment, the doped silicon dioxide of first material 26 comprises no more than 30 atomic percent total dopant atoms other than silicon and oxygen, in one embodiment at least $1\times10^{18}$ atoms/cm$^3$ of total dopant atoms other than silicon and oxygen, in one embodiment at least 1 atomic percent of total dopant atoms other than silicon and oxygen, and in one embodiment at least 5 atomic percent of total dopant atoms other than silicon and oxygen. In one embodiment, the doped silicon dioxide of first material 26 comprises at least one of borophosphosilicate glass (BPSG), borosilicate glass (BSG), and phosphosilicate glass (PSB). In one embodiment, the undoped silicon dioxide of second material 24 comprises from 0 atoms/cm$^3$ to no more than at least $1\times10^{10}$ atoms/cm$^3$ of total dopant atoms other than silicon and oxygen, and in one embodiment comprises from 0 atoms/cm$^3$ to no more than least $1\times10^{5}$ atoms/cm$^3$ of total dopant atoms other than silicon and oxygen.

Channel openings 25 have been formed (e.g., by etching) through insulative tiers 20 and conductive tiers 22 to conductor tier 16. Channel openings 25 may taper radially-inward (not shown) moving deeper in stack 18. In some embodiments, channel openings 25 may go into conductor material 17 of conductor tier 16 as shown or may stop there-atop (not shown). Alternately, as an example, channel openings 25 may stop atop or within the lowest insulative tier 20. A reason for extending channel openings 25 at least to into conductor material 17 of conductor tier 16 is to provide and anchoring effect to material that is within channel openings 25. Etch-stop material (not shown) may be within or atop conductor material 17 of conductor tier 16 to facilitate stopping of the etching of channel openings 25 relative to conductor tier 16 when such is desired. Such etch-stop material may be sacrificial or non-sacrificial.

Horizontally-elongated trenches 40 have been formed (e.g., by anisotropic etching) into stack 18 to form laterally-spaced memory-block regions 58. By way of example and for brevity only, channel openings 25 are shown as being arranged in groups or columns of staggered rows of four and five channel openings 25 per row and being arrayed in laterally-spaced memory-block regions 58 that will comprise laterally-spaced memory blocks 58 in a finished circuitry construction. In this document, "block" is generic to include "sub-block". Trenches 40 will typically be wider than channel openings 25 (e.g., 10 to 20 times wider, yet such wider degree not being shown for brevity). Memory-block regions 58 and resultant memory blocks 58 (not yet shown) may be considered as being longitudinally elongated and oriented, for example along a direction 55. Any alternate existing or future-developed arrangement and construction may be used.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally-between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally-between the channel material and the storage material.

FIGS. 1-4 show one embodiment wherein charge-blocking material 30, storage material 32, and charge-passage material 34 have been formed in individual channel openings 25 elevationally along insulative tiers 20 and conductive tiers 22. Transistor materials 30, 32, and 34 (e.g., memory-cell materials) may be formed by, for example, deposition of respective thin layers thereof over stack 18 and within individual openings 25 followed by planarizing such back at least to a top surface of stack 18.

Channel material 36 has also been formed in channel openings 25 elevationally along insulative tiers 20 and conductive tiers 22, thus comprising individual operative channel-material strings 53 in channel openings 25. Channel-material strings 53 in one embodiment have memory-cell materials (e.g., 30, 32, and 34) there-along and with second-tier material (e.g., 24) being horizontally-between immediately-adjacent channel-material strings 53. Materials 30, 32, 34, and 36 are collectively shown as and only designated as material 37 in FIGS. 1 and 2 due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted to remove materials 30, 32, and 34 from the bases of channel openings 25 (not shown) to expose conductor tier 16 such that channel material 36 is directly against conductor material 17 of conductor tier 16. Such punch etching may occur separately with respect to each of materials 30, 32, and 34 (as shown) or may occur with respect to only some not shown). Alternately, and by way of example only, no punch etching may be conducted and channel material 36 may be directly electrically coupled to conductor material 17 of conductor tier 16 only by a separate conductive interconnect (not yet shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown).

Figure 5:
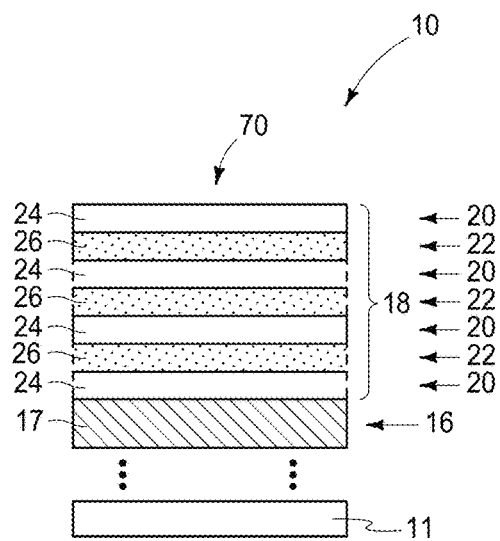
FIG. 5 is a view of another portion of the substrate not shown in FIG. 1.
Figure 6:
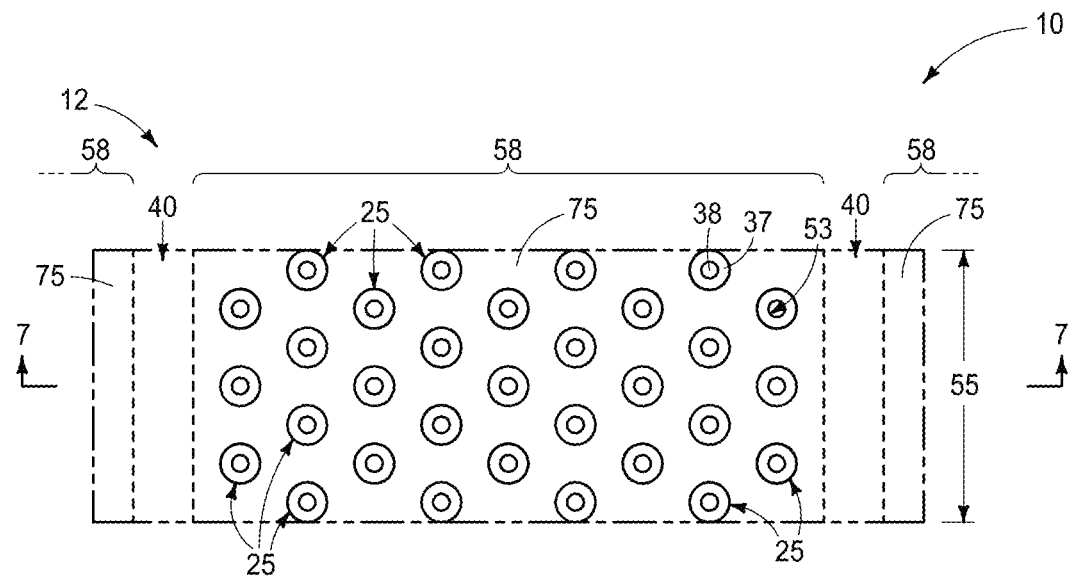
FIGS. 6-15 are diagrammatic sequential sectional, expanded, enlarged, and/or partial views of the construction of FIGS. 1-5, or portions thereof, in process in accordance with some embodiments of the invention.
Figure 7:
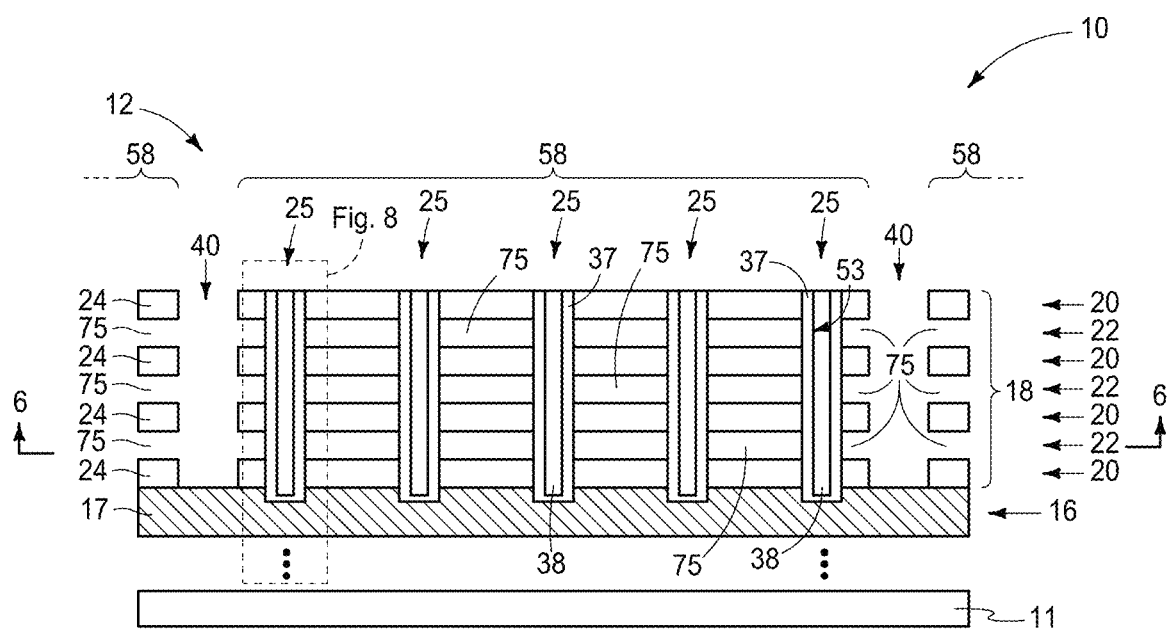
Figure 8:
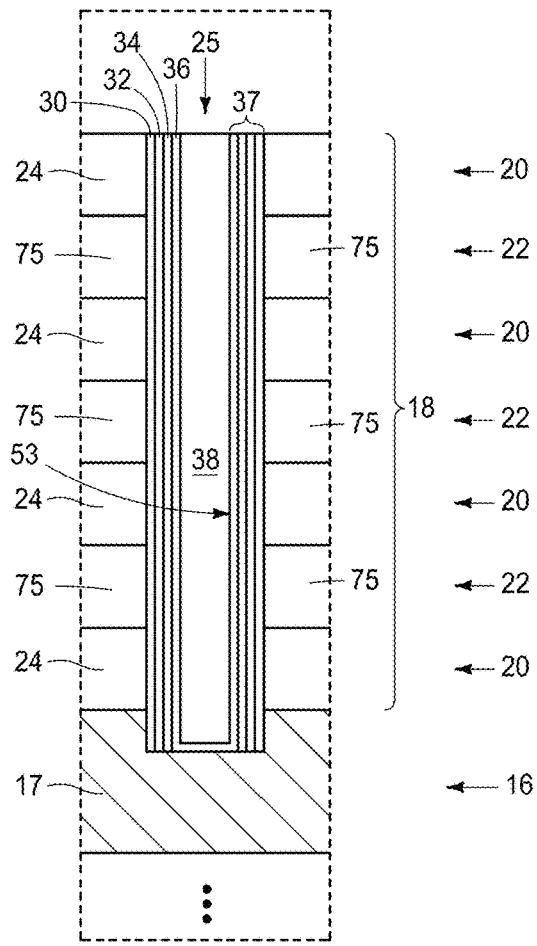
Figure 9:
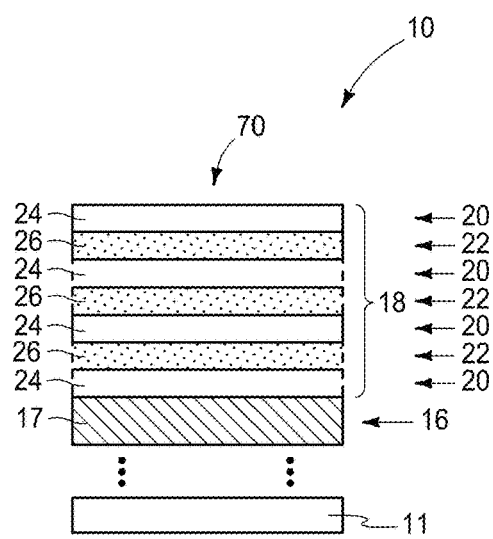
Figure 10:
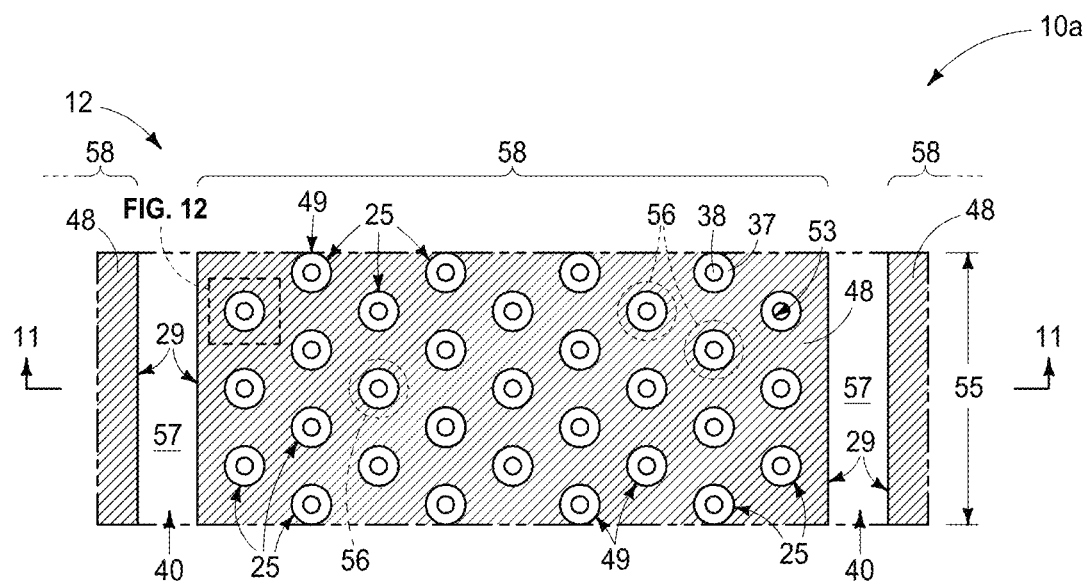
Figure 11:
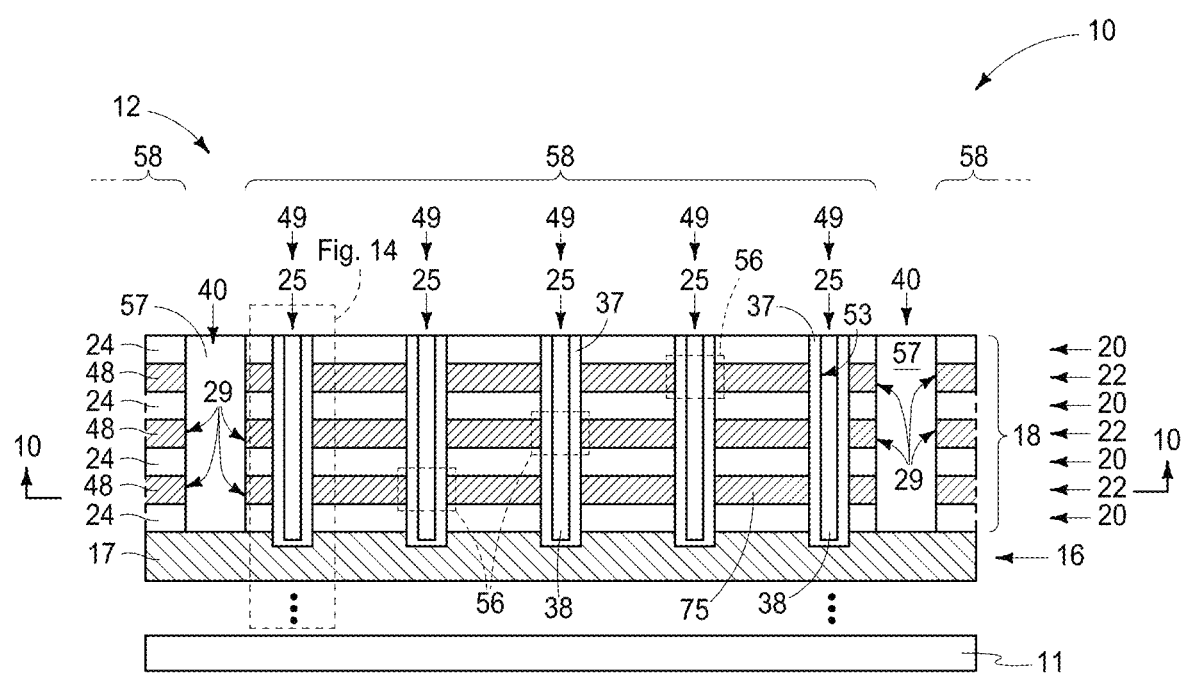
Figure 12:
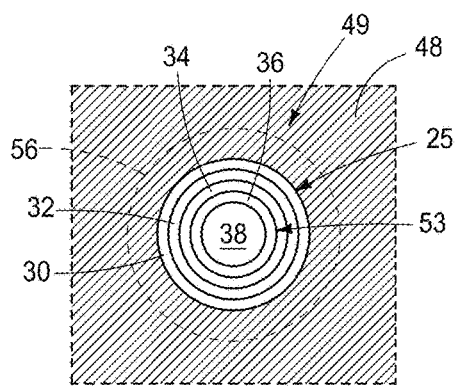
Figure 13:
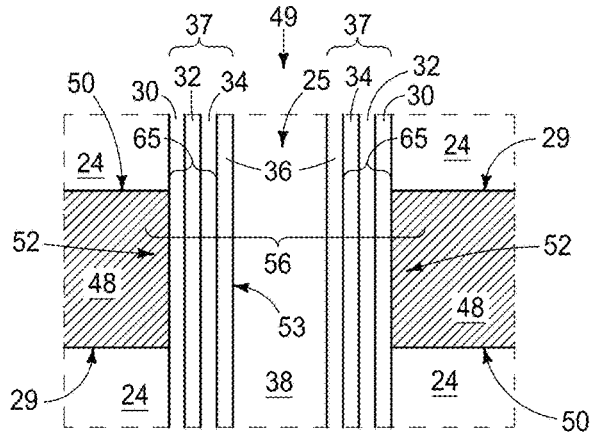
Figure 14:
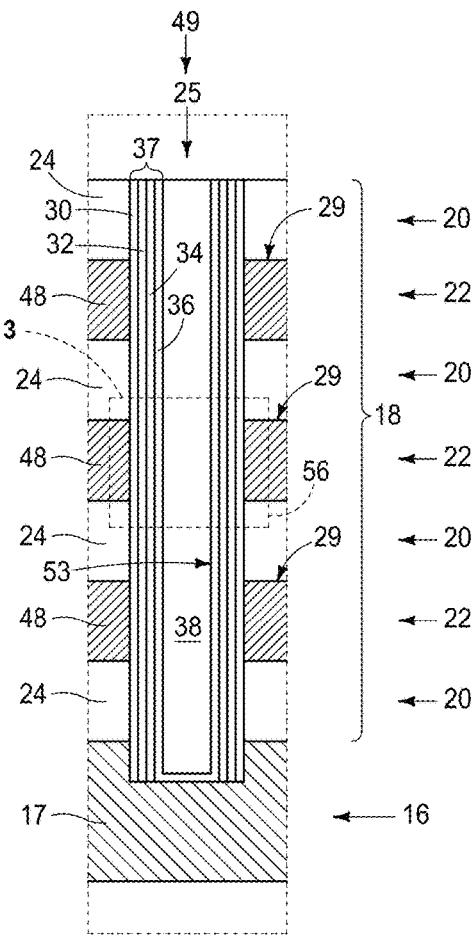
Figure 15:
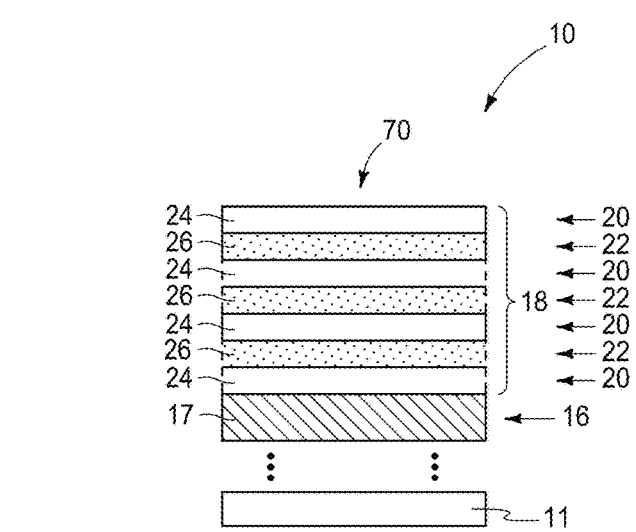

In some embodiments, construction 10 may be considered as comprising a first region (e.g., as shown by FIGS. 1 and 2) and a second region 70 aside the first region (e.g., as shown in FIG. 5). Second region 70 may be laterally-contacting the first region (not shown) or may be laterally-spaced from the first region (e.g., closely laterally thereadjacent but not touching, or laterally-far there-from). Second region 70 may be within one or more of the memory block regions (not shown). In some embodiments, construction 10 may be considered as comprising a first vertical stack (e.g., stack 18 in FIG. 2) and a second vertical stack (e.g., stack 18 in second region 70), with the second stack comprising vertically alternating first and second insulating tiers (e.g., tiers 22 and 20, respectively, in FIG. 5 and regardless of whether tiers 22 and 20 are conductive, insulative, or semiconductive at this point of processing or in a finished construction).

Referring to FIGS. 6-9, and in one embodiment, doped silicon dioxide 26 that is in first tiers 22 (e.g., in the first region and now not there-shown) has been etched selectively relative to undoped silicon dioxide 24 that is in second tiers 20 (e.g., in the first region), thus leaving void space 75 in first tiers 22. Such etching may be conducted using any existing or future-developed chemistries and conditions. In one embodiment, the etching is conducted with an etching chemistry that is at least predominantly in the vapor phase ("predominantly" herein meaning more than 50% by volume), and in another embodiment the etching is conducted with an etching chemistry that is at least predominantly in the liquid phase. An example ideal vapor phase chemistry is a combination of hydrogen fluoride and water (e.g., at 5° C. to 35° C., 200 mTorr to 200 Torr, 100 sccm to 500 sccm HF, 50 sccm to 200 sccm $H_2O$), and an example ideal liquid phase chemistry is a combination of ammonium hydroxide and water (e.g., at room pressure and at room or elevated temperature), each of which may achieve etch selectivity of doped silicon dioxide relative to undoped silicon dioxide in the multi-thousands by volume. In one embodiment and as shown, the etching has occurred in the first region (e.g., FIGS. 1 and 2) and has not occurred in second region 70, for example if trenches 40 are not formed in second region 70 or undoped silicon dioxide 24 is otherwise not laterally etched in second region 70.

Referring to FIGS. 10-15, conducting material 48 has been formed in void space 75 (not so designated in FIGS. 10-14) in first tiers 22 that is left by the example etching shown by FIGS. 6-9. Conducting material 48 has thereafter been removed from trenches 40, thus forming individual conductive lines 29 (e.g., wordlines) and elevationally-extending strings 49 of individual transistors and/or memory cells 56. A thin insulative liner (e.g., $Al_2O_3$ and not shown) may be formed before forming conducting material 48. Approximate locations of transistors and/or memory cells 56 are indicated with a bracket in FIG. 13 and some with dashed outlines in FIGS. 10-12 and 14, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 (FIG. 13) corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Intervening material 57 has been formed in trenches 40 and thereby laterally-between and longitudinally-along immediately-laterally-adjacent memory blocks 58. Intervening material 57 may provide lateral electrical isolation (insulation) between immediately-laterally-adjacent memory blocks. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, $Al_2O_3$, and undoped polysilicon. Intervening material 57 may include through array vias (not shown).

In one embodiment and as shown, the forming of conducting material 48 in void space 75 occurs in the first region and not in second region 70 such that doped silicon dioxide 26 (at least some of) in first tiers 22 and undoped silicon dioxide 24 (at least some of) in second tiers 20 remain in second region 70 in a finished construction of the integrated circuitry.

Any other attribute(s) or aspect(s) as shown and/or described herein with respect to other embodiments may be used in the embodiments shown and described with reference to the above embodiments.

In some embodiments, a method used in forming integrated circuitry (e.g., 10, and regardless of whether comprising memory) comprises forming a stack (e.g., 18) comprising vertically-alternating first tiers (e.g., 22) and second tiers (e.g., 20), with the first tiers comprising doped silicon dioxide and the second tiers comprising undoped silicon dioxide. Horizontally-elongated trenches (e.g., 40) have been formed into the stack. Through the trenches, the doped silicon dioxide that is in the first tiers has been etched selectively relative to the undoped silicon dioxide that is in the second tiers. Conducting material (e.g., 48) is formed in void space (e.g., 75) in the first tiers that is left by the etching. Any other attribute(s) or aspect(s) as shown and/or described herein with respect to other embodiments may be used.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, integrated circuitry (e.g., 10, and regardless of whether comprising memory) comprises a first vertical stack (e.g., 18 in FIG. 2) comprising alternating insulative tiers (e.g., 20, and regardless of whether comprising doped silicon dioxide, undoped silicon dioxide, and/or other insulative composition) and conductive tiers (e.g., 22). The conductive tiers individually comprising a horizontally-elongated conductive line (e.g., 29). A second vertical stack (e.g., 18 in FIG. 15) is aside the first vertical stack. The second vertical stack comprises alternating first insulating tiers (e.g., 20) and second insulating tiers (e.g., 22 in FIG. 15). The first insulating tiers are individually at least predominantly doped silicon dioxide and the second insulating tiers are individually at least predominantly undoped silicon dioxide. Any other attribute(s) or aspect(s) as shown and/or described herein with respect to other embodiments may be used.

In one embodiment, integrated circuitry (e.g., 10) comprises a memory array (e.g., 12) comprising strings (e.g., 49) of memory cells (e.g., 56). The integrated circuitry comprises laterally-spaced memory blocks (e.g., 58) individually comprising a first vertical stack (e.g., 18 in FIG. 2) comprising alternating insulative tiers (e.g., 20, and regardless of whether comprising doped silicon dioxide, undoped silicon dioxide, and/or other insulative composition) and conductive tiers (e.g., 22). Strings (e.g., 49) of memory cells (e.g., 12) comprising channel-material strings (e.g., 53) extend through the insulative tiers and the conductive tiers. The conductive tiers individually comprise a horizontally-elongated conductive line (e.g., 29). A second vertical stack (e.g., 18 in FIG. 15) is aside the first vertical stack. The second vertical stack comprises alternating first insulating tiers (e.g., 20) and second insulating tiers (e.g., 22 in FIG. 15). The first insulating tiers are individually at least predominantly doped silicon dioxide. The second insulating tiers are individually at least predominantly undoped silicon dioxide. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least. 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming integrated circuitry comprises forming a stack comprising vertically-alternating first tiers and second tiers. The first tiers comprise doped silicon dioxide and the second tiers comprise undoped silicon dioxide. Horizontally-elongated trenches are formed into the stack. Through the trenches, the doped silicon dioxide that is in the first tiers is etched selectively relative to the undoped silicon dioxide that is in the second tiers. Conducting material is formed in the void space in the first tiers that is left by the etching.

In some embodiments, a method used in forming a memory array comprising strings of memory cells comprises forming a stack comprising vertically-alternating first tiers and second tiers. The first tiers comprise doped silicon dioxide and the second tiers comprise undoped silicon dioxide. The stack comprises laterally-spaced memory-block regions that have horizontally-elongated trenches there-between. Channel-material strings extend through the first tiers and the second tiers in the memory-block regions. Through the trenches, the doped silicon dioxide that is in the first tiers is etched selectively relative to the undoped silicon dioxide that is in the second tiers. Conducting material of conductive lines is formed in the void space in the first tiers that is left by the etching. Intervening material is formed in the trenches laterally-between and longitudinally-along immediately-laterally-adjacent of the memory-block regions.

In some embodiments, integrated circuitry comprises a first vertical stack comprising alternating insulative tiers and conductive tiers. The conductive tiers individually comprise a horizontally-elongated conductive line. A second vertical stack is aside the first vertical stack. The second vertical stack comprises alternating first insulating tiers and second insulating tiers. The first insulating tiers individually at least predominantly are doped silicon dioxide. The second insulating tiers individually at least predominantly are undoped silicon dioxide.

In some embodiments, integrated circuitry comprising a memory array comprising strings of memory cells comprises laterally-spaced memory blocks individually comprising a first vertical stack comprising alternating insulative tiers and conductive tiers. Strings of memory cells comprise channel-material strings that extend through the insulative tiers and the conductive tiers. The conductive tiers individually comprise a horizontally-elongated conductive line. A second vertical stack is aside the first vertical stack. The second vertical stack comprises alternating first insulating tiers and second insulating tiers. The first insulating tiers individually at least predominantly are doped silicon dioxide. The second insulating tiers individually at least predominantly are undoped silicon dioxide.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming integrated circuitry, comprising:
    forming a stack comprising vertically-alternating first tiers and second tiers, the first tiers comprising doped silicon dioxide, the second tiers comprising undoped silicon dioxide;
    forming horizontally-elongated trenches into the stack;
    through the trenches, etching the doped silicon dioxide that is in the first tiers selectively relative to the undoped silicon dioxide that is in the second tiers;
    forming conducting material in void space in the first tiers that is left by the etching; and
    the stack comprising a first region and a second region aside the first region, the etching and the forming conducting material in the void space occurring in the first region and not in the second region such that the doped silicon dioxide in the first tiers and the undoped silicon dioxide in the second tiers remain in the second region in a finished construction of the integrated circuitry.

2. The method of claim 1 wherein the doped silicon dioxide comprises at least $1 \times 10^{18}$ atoms/cm$^3$ of total dopant atoms other than silicon and oxygen.

3. The method of claim 1 wherein the doped silicon dioxide comprises at least 1 atomic percent total dopant atoms other than silicon and oxygen.

4. The method of claim 1 wherein the doped silicon dioxide comprises at least 5 atomic percent total dopant atoms other than silicon and oxygen.

5. The method of claim 1 wherein the doped silicon dioxide comprises at least $1 \times 10^{18}$ atoms/cm$^3$ to no more than 30 atomic percent total dopant atoms other than silicon and oxygen.

6. The method of claim 1 wherein the doped silicon dioxide comprises at least one of BPSG, BSG, and PSG.

7. The method of claim 1 wherein the undoped silicon dioxide comprises from 0 atoms/cm$^3$ to no more than $1 \times 10^{10}$ atoms/cm$^3$ of total dopant atoms other than silicon and oxygen.

8. The method of claim 1 wherein the undoped silicon dioxide comprises from 0 atoms/cm$^3$ to no more than $1 \times 10^{5}$ atoms/cm$^3$ of total dopant atoms other than silicon and oxygen.

9. The method of claim 1 wherein the etching is conducted with an etching chemistry that is at least predominantly in the vapor phase.

10. The method of claim 1 wherein the etching is conducted with an etching chemistry that is at least predominantly in the liquid phase.

11. A method used in forming a memory array comprising strings of memory cells, comprising:
    forming a stack comprising vertically-alternating first tiers and second tiers, the first tiers comprising doped silicon dioxide, the second tiers comprising undoped silicon dioxide, the stack comprising laterally-spaced memory-block regions having horizontally-elongated trenches there-between, channel-material strings extending through the first tiers and the second tiers in the memory-block regions;
    through the trenches, etching the doped silicon dioxide that is in the first tiers selectively relative to the undoped silicon dioxide that is in the second tiers;
    forming conducting material of conductive lines in void space in the first tiers that is left by the etching; and
    forming intervening material in the trenches laterally-between and longitudinally-along immediately-laterally-adjacent of the memory-block regions.

12. The method of claim 11 wherein the stack comprises a first region and a second region aside the first region, the channel-material strings being formed in the first region, the etching and the forming conducting material in the void space occurring in the first region and not in the second region such that the doped silicon dioxide in the first tiers and the undoped silicon dioxide in the second tiers remain in the second region in a finished construction of the memory array.

13. The method of claim 11 wherein the channel-material strings comprise part of strings of memory cells in the stack in a finished integrated circuitry construction, individual of the memory cells being in individual of the first tiers and comprising:
    the channel material of the channel-material strings;
    a gate region that is part of one of the conductive lines; and a memory structure laterally-between the gate region and the channel material, the memory structure comprising:
  a charge-blocking region laterally-adjacent the gate region;
  insulative charge-passage material laterally-adjacent the channel material; and
  storage material that is laterally-between the charge-blocking region and the insulative charge-passage material.

14. The method of claim 13 wherein the memory array comprises NAND.

* * * * *